United States Patent
Kobayashi

(10) Patent No.: US 7,605,021 B2
(45) Date of Patent: Oct. 20, 2009

(54) MANUFACTURING METHOD OF ELECTRONIC DEVICE

(75) Inventor: Hiroshi Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 51 days.

(21) Appl. No.: 11/983,867

(22) Filed: Nov. 13, 2007

(65) Prior Publication Data

US 2008/0176361 A1    Jul. 24, 2008

(30) Foreign Application Priority Data

Jan. 18, 2007    (JP) .............................. 2007-009264

(51) Int. Cl.
*H01L 21/60* (2006.01)
*H01L 21/603* (2006.01)
*H01L 23/02* (2006.01)

(52) U.S. Cl. ....................... 438/118; 438/106; 438/113; 438/114; 438/126; 257/E21.505

(58) Field of Classification Search ................... 438/64, 438/106, 108, 118, 119, 124, 126, 464; 257/E21.505
See application file for complete search history.

(56) References Cited

U.S. PATENT DOCUMENTS 5,435,732 A * 7/1995 Angulas et al. ............... 439/67
6,099,678 A * 8/2000 Kotato et al. ................ 156/256
6,664,645 B2 * 12/2003 Kawai ......................... 257/778
6,730,579 B1 * 5/2004 Sasaka ........................ 438/464
2004/0203235 A1 * 10/2004 Miyakawa ................. 438/689
2006/0030129 A1 * 2/2006 Ohmiya et al. ............. 438/462
2006/0049498 A1 * 3/2006 Kovac et al. ................ 257/678
2007/0281395 A1 * 12/2007 Kira et al. ................... 438/118

FOREIGN PATENT DOCUMENTS

| JP | 2000-194814 | 6/2000 |
| JP | 2000194814 A * | 7/2000 |
| JP | 2001-156110 | 6/2001 |
| JP | 2001156110 A * | 6/2001 |

* cited by examiner

*Primary Examiner*—Zandra Smith
*Assistant Examiner*—Jeremy J Joy
(74) *Attorney, Agent, or Firm*—Greer, Burns & Crain, Ltd.

(57) ABSTRACT

A manufacturing method of manufacturing an electronic device, includes the steps of: applying a thermosetting adhesive on a surface of a base having a conductive pattern formed on a film; mounting a circuit chip on the base through the thermosetting adhesive; holding the base while pressing a circuit chip side of the base and a film side of the base by a heating apparatus that heats the thermosetting adhesive; giving a tension to the base on which the circuit chip is mounted; and heating the thermosetting adhesive by the heating apparatus to cure the thermosetting adhesive, thereby fixing the circuit chip to the conductive pattern.

2 Claims, 10 Drawing Sheets

MANUFACTURING METHOD OF ELECTRONIC DEVICE

BACKGROUND OF THE INVENTION

1. Field of the Invention

The present invention relates to a manufacturing method of an electronic device, particularly an electronic device in which a circuit chip is mounted on a film-shaped base.

2. Description of the Related Art

Conventionally, an electronic device in which a circuit chip is mounted on a base, such as a printed-circuit board, has been widely known. Such an electronic device is used for applications such as for being arranged in an electronic apparatus to control the electronic apparatus, or for being used alone for exchanging information with an external apparatus. For example, as the electronic device, there are various types of RFID (Radio_Frequency_IDentification) tags which exchange information using a radio wave without contacting with an external apparatus typified by a reader-writer. As one kind of those RFID tags, there has been proposed an RFID tag having a configuration in which a conductor pattern for radio communication and an IC chip are mounted on a base sheet. A conceivable usage form of such type of RFID tag is that the RFID tag is attached to an article and exchanges information with an external apparatus to perform an identification of the article.

A RFID tag is required to be miniaturized and light weighted, specifically, thinned, flexible and low-cost. In response to such a demand, for example, there has been proposed a RFID tag in which a film made of a resin such as polyethylene terephthalate (PET) is applied as a material for a base on which an IC chip is mounted. (See, for example, Japanese Patent Application Publication 2001-156110)

FIG. 9 is a diagram showing a manufacturing method of a RFID tag according to a conventional technique.

Parts (a) to (d) of FIG. 9 sequentially show each step of manufacturing a RFID tag.

In manufacturing a RFID tag, first, as shown in part (a) of FIG. 9, a base in which a conductive pattern 912 functioning as an antenna of the RFID tag is formed on a film 911 is prepared, and a thermosetting adhesive 93p, which is cured by heating, is applied on the base 91.

Next, as shown in part (b) of FIG. 9, an IC chip 92 is mounted on a portion of the base 91 on which the thermosetting adhesive 93p is applied. Bumps 921, which are to be connected to the conductive pattern 912, are formed on the IC chip 92. As shown in part (c) of FIG. 9, the IC chip 92 is mounted on the base 91 such that positions of the bumps 921 and the conductive pattern 912 match.

Next, as shown in part (d) of FIG. 9, the base 91 on which the IC chip 92 is mounted is sandwiched from both sides, i.e., the film 911 side and the IC chip 92 side of the base 91, between parts 81 and 82 of a heating apparatus 8. Next, the thermosetting adhesive 93p is heated by a heating head 81, which abuts on the IC chip 92 side of the heating apparatus 8, thereby being cured. Thus, the IC chip 92 is fixed to the base 91 in a state in which the bumps 921 are in contact with the conductive pattern 912. Accordingly, a miniaturized and lightweight RFID tag is finished.

However, PET, a material for the film 911 may be easily deformed by heating when the thermosetting adhesive 93p is cured, because the glass transition point of PET is about 67 degrees centigrade and a heat proof temperature of PET is low.

FIG. 10 is a diagram explaining a state of a base in a step of heating shown in part (d) of FIG. 9.

As shown in part (a) of FIG. 10, when heating is performed in a state in which the IC chip 92 is mounted on the base 91, temperature of the base 91 rises and the film 911 is deformed as shown in part (b) of FIG. 9. When the thermosetting adhesive 93p flows as the film 911 deforms, bubbles are produced inside the thermosetting adhesive 93p and remain as voids 931 after the thermosetting adhesive is cured. The voids 931 in the cured thermosetting adhesive 93p deteriorate adhesiveness between the IC chip 92 and the base 911, thereby reducing reliability of the RFID tag.

The problem of reliability reduction according to such void production is not limited to a RFID tag, but is a common problem for an electronic device in which a circuit chip is mounted on a film-shaped base.

SUMMARY OF THE INVENTION

In view of the foregoing, it is an object of the present invention to provide a manufacturing method of an electronic device having improved reliability by preventing void production.

In accordance with the invention, a manufacturing method of manufacturing an electronic device, including the steps of:

applying a thermosetting adhesive on a surface of a base that is formed such that a conductive pattern is formed on a film made of a resin, the surface of the base being a side of the base on which side the conductive pattern is formed;

mounting a circuit chip to be connected to the conductive pattern, on the base through the thermosetting adhesive;

holding the base while pinching a circuit chip side of the base and a film side of the base by a heating apparatus that heats the thermosetting adhesive, the heating apparatus including a pressing section that presses the base by abutting on the circuit chip side of the base and a supporting section that supports the base by abutting on the film side of the base;

giving a tension to the base on which the circuit chip is mounted, in a direction in which the film spreads; and heating the thermosetting adhesive by the heating apparatus to cure the thermosetting adhesive, thereby fixing the circuit chip to the conductive pattern.

In the manufacturing method of manufacturing an electronic device according to the invention, since a tension is given to the base in a direction in which the film spreads, a deformation of the film is suppressed as the film is heated and melted. Accordingly, the generation of a void following a deformation of the film is suppressed in the thermosetting adhesive. In addition, a production yield rate of an electronic device rises, thereby lowering the manufacturing cost.

Here, in the manufacturing method of manufacturing an electronic device the invention above-described, it is preferable that the manufacturing method of manufacturing an electronic device further includes the step of setting a pair of retaining projections on both sides of a mounting area of the film in which mounting area the circuit chip is mounted, wherein the step of giving a tension is a step of pulling the pair of the retaining projections in a direction in which the pair of the retaining projections move away from each other.

In the step of giving a tension, a pair of the retaining projections is provided and the pair is pulled in a direction in which they move away from each other so that a tension can be readily given in a direction in which the film spreads.

In addition, in the manufacturing method of manufacturing an electronic device the invention above-described, the step of giving a tension may be a step of holding portions of the film on both sides of the mounting area of the film in which mounting area the circuit chip is mounted, and pulling the portions in a direction in which the portions move away from each other.

Further, in the manufacturing method of manufacturing an electronic device the invention above-described, it is preferable that the manufacturing method of manufacturing an electronic device, wherein the base is formed such that a plurality of the conductive patterns are arranged side by side on a sheet of a film, the step of applying is a step of applying a thermosetting adhesive to each of the plurality of conductive patterns on the base, the step of mounting is a step of mounting each of a plurality of circuit chips on the base so that each of the circuit chips is connected to each of the plurality of conductive patterns, the step of holding is a step of holding each of the plurality of the conductive patterns such that a portion of the film between the conductive patterns adjacent to each other of the plurality of the conductive patterns on the base remains without being held, the step of giving a tension is a step of giving a tension to the base through pulling, by a fixture, the portion of the film that has remained without being held in the step of holding, and the manufacturing method further includes the step of cutting the base to form a plurality of electronic devices.

In a case in which multiple electronic devices are formed by cutting a base on which multiple of circuit chips are mounted, in the step of holding, a portion of the film between the conductive patterns is made to remain without being held and this remaining portion is pulled so that a tension can be readily given to the base.

As described above, according to the invention, a generation of a void is suppressed so that a manufacturing method of an electronic device with high reliability can be obtained.

DETAILED DESCRIPTION OF THE INVENTION

Exemplary embodiments of the invention will be described with reference to the attached drawings.

Figure 1:
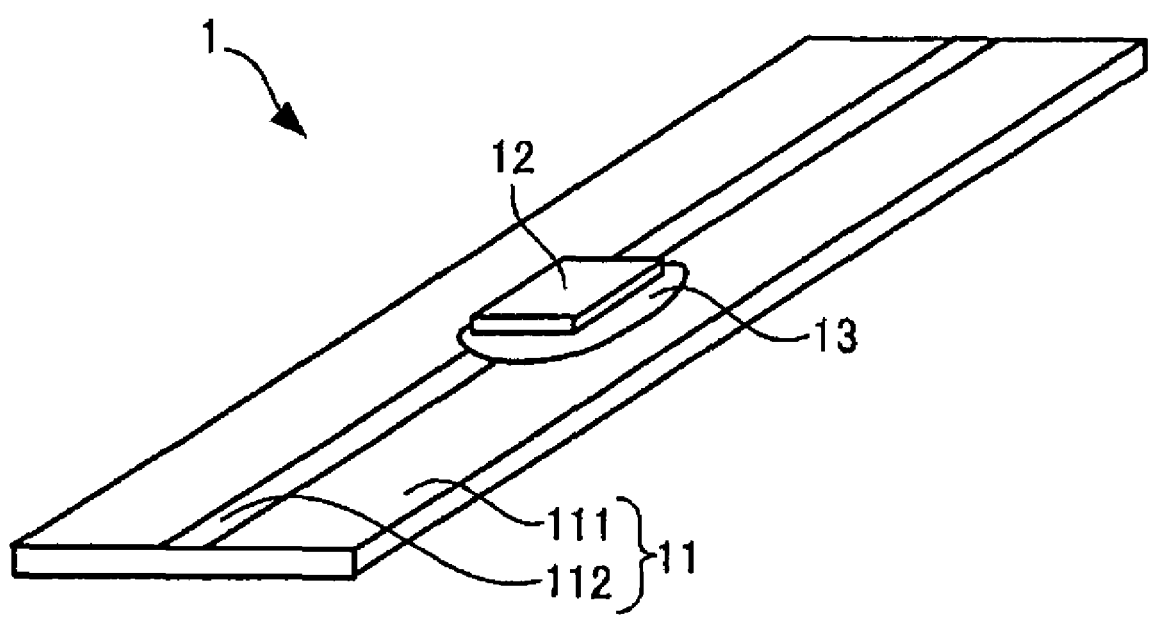
FIG. 1 is a perspective view showing a RFID tag manufactured according to one embodiment of the invention.

FIG. 1 is a perspective view showing a RFID tag to be manufactured according to one embodiment of the invention.

A RFID tag 1 shown in FIG. 1 includes a base 11 in which an antenna pattern 112 made of metal is formed on a film 111 made of a PET material, an IC chip 12 mounted on the base 11 and a thermosetting adhesive 13 adhering the IC chip 12 to the base 11.

The RFID tag 1 is an electronic device which exchanges information with a reader-writer in a non-contact manner. The RFID tag 1 receives by the antenna pattern 112 electromagnetic energy radiated by the reader-writer as electrical energy, which drives the IC chip 12 to actualize a communication operation.

Here, the RFID tag 1, the antenna pattern 112 and the IC chip 12 correspond to examples of the electronic device, the conductive pattern and the circuit chip according to the invention respectively.

In some cases, among those skilled in the art corresponding to the invention, the "RFID tag" in this description may be called a "RFID tag inlay" as an internal constituent member (inlay) for the "RFID tag." In some other cases, this "RFID tag" is called a "wireless IC tag." In addition, "the RFID tag" includes a non-contact type IC card.

Hereinafter, a manufacturing method of the RFID tag 1 will be described.

Figure 2:
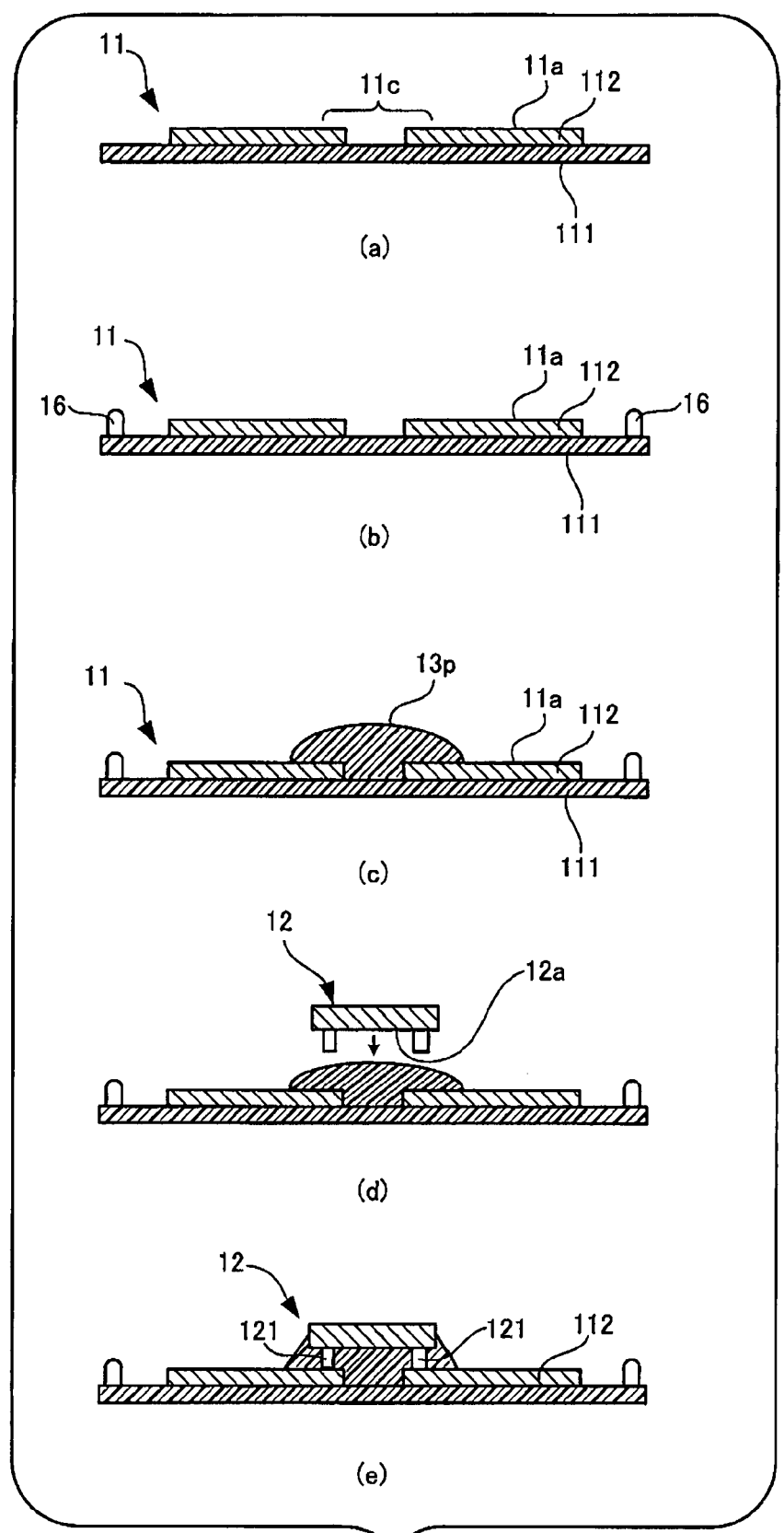
FIG. 2 is a diagram explaining each step in a manufacturing method of manufacturing the RFID shown in FIG. 1 as an embodiment of the invention.
Figure 3:
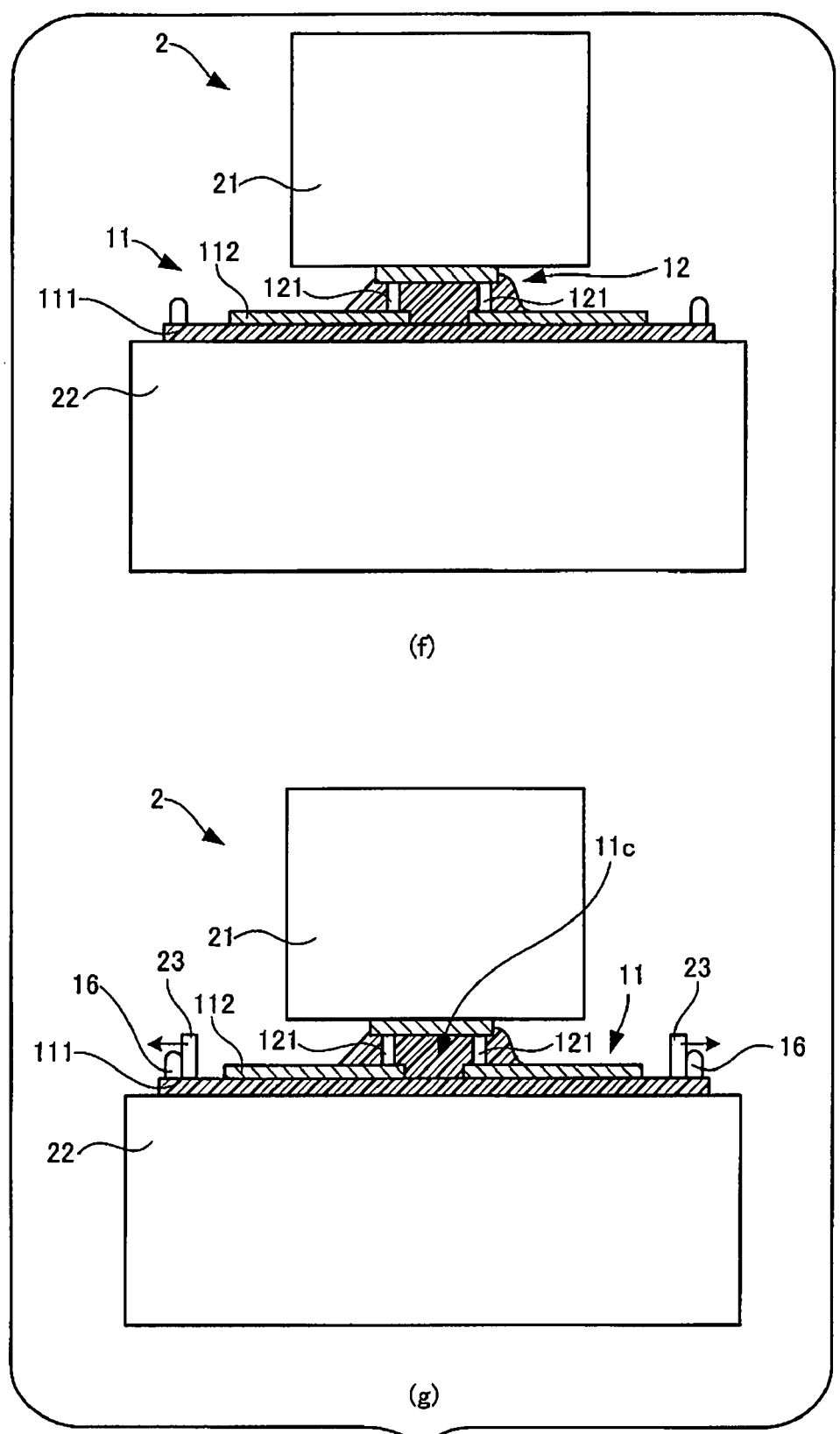
FIG. 3 is a diagram showing a manufacturing step subsequent to the steps shown in parts (a) to (e) of FIG. 2.
Figure 4:
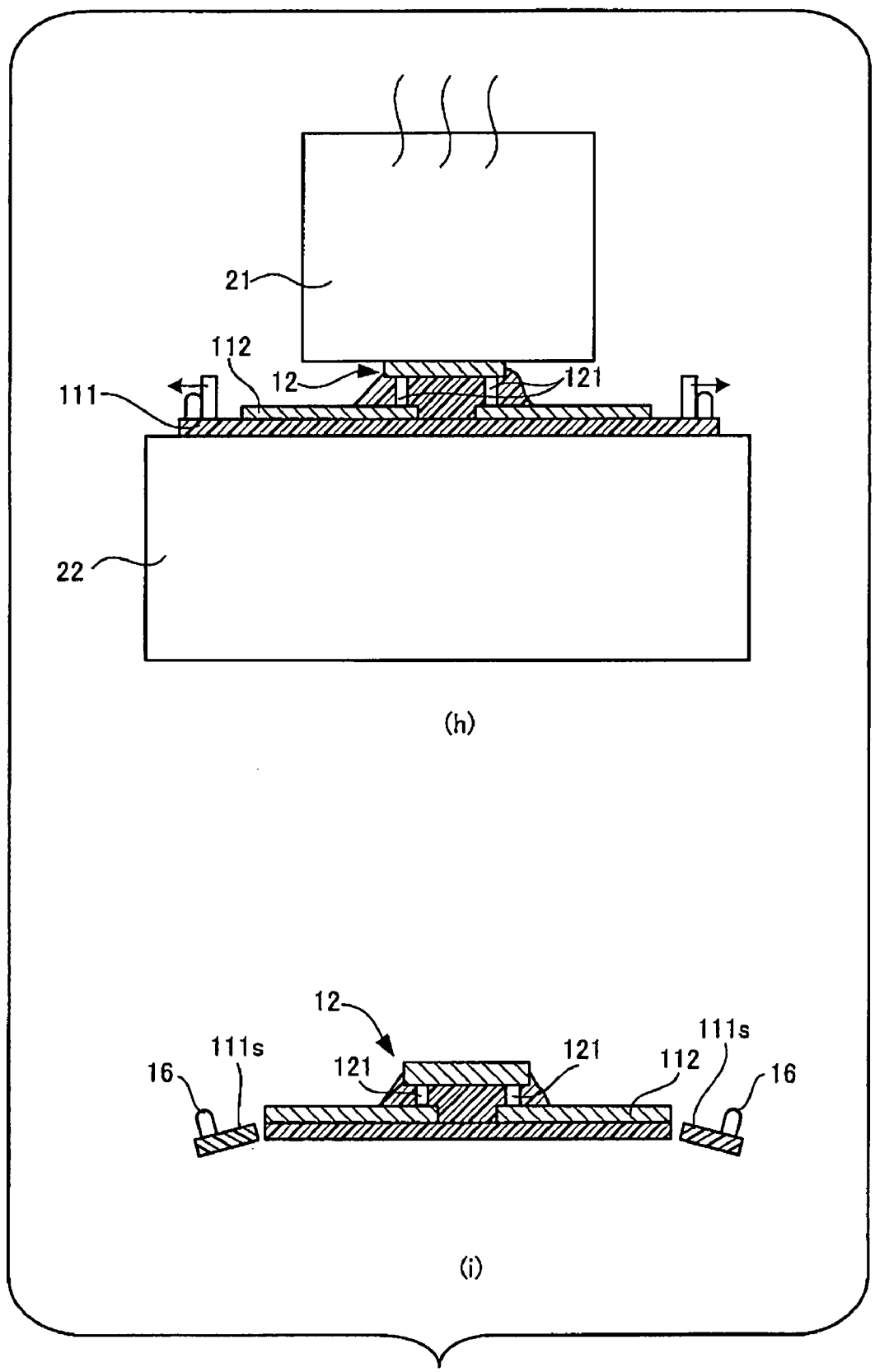
FIG. 4 is a diagram showing a manufacturing step subsequent to the steps shown in parts (f) and (g) of FIG. 3.

FIGS. 2, 3 and 4 are diagrams explaining a manufacturing method of manufacturing the RFID shown in FIG. 1 as an embodiment of the invention.

Processes included in the manufacturing method of the RFID tag 1 are shown sequentially in parts (a) to (e) of FIG. 2. Each step subsequent to the steps shown in FIG. 2 is shown sequentially in parts (f) and (g) of FIG. 3. Each step subsequent to the steps shown in FIG. 3 is shown sequentially in part (h) and (i) of FIG. 4. For the convenience to view, a size in the thickness direction of the RFID tag 1 and the IC chip 12 are expressed exaggerated comparing to those shown in FIG. 1.

For manufacturing the RFID tag 1, first, the antenna pattern 112 is formed on a mounting surface 11a of the film 111 in a conductor-forming step shown in part (a) of FIG. 2. The antenna pattern 112 is formed through forming a layer made of cupper on the film 111, further forming a resist layer and performing an etching. Specifically, the antenna pattern 112 may be formed also by printing a silver paste or other method. In the conductor-forming step, the base 11 in which the antenna pattern 112 is formed on the film 111 is obtained. In a latter step, the IC chip will be mounted on a mounting area 11c on a side of the mounting surface 11a of the base 11. The film 111 is formed longer than the antenna pattern 112.

Next, in a step of setting a projection shown in part (b) of FIG. 2, retaining pins 16 are provided on both sides of the mounting area 11c of the film 111 interposed therebetween.

Figure 5:
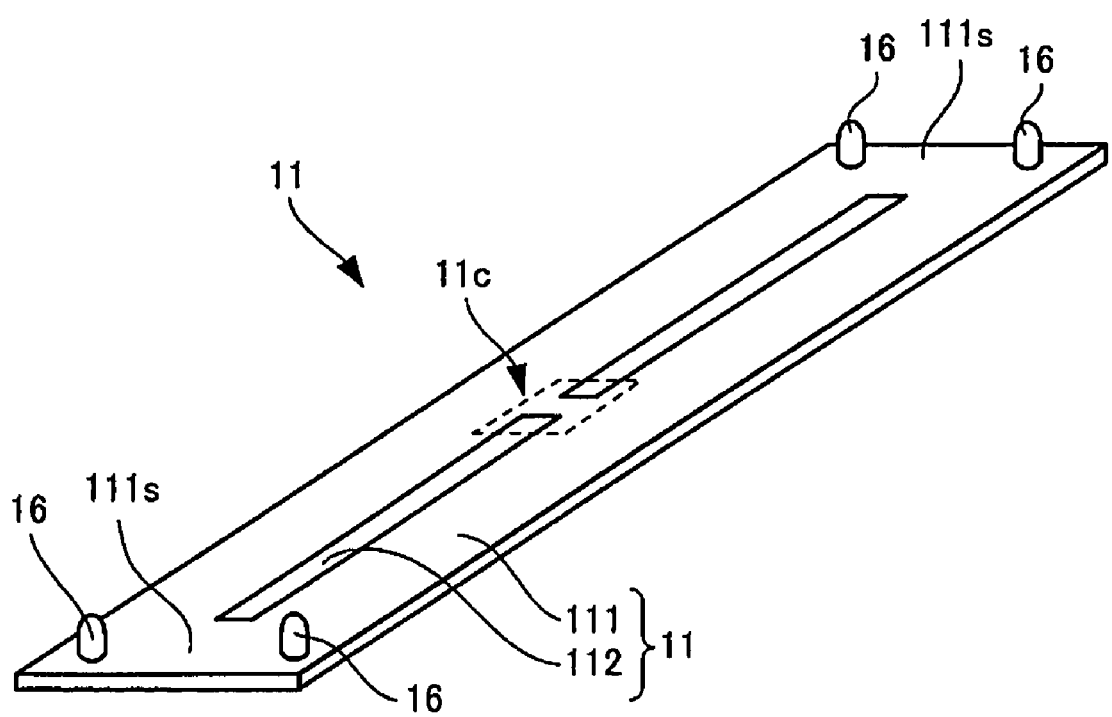
FIG. 5 is a plan view showing a base provided with retaining pins in a step of setting a projection shown in part (b) of FIG. 2.

FIG. 5 is a plan view showing the base in which the retaining pins are provided in the step of setting a projection shown in part (b) of FIG. 2. In the present embodiment, two pairs of retaining pins 16 which are made of a resin material and have columnar shapes are set at end portions 111s of the film 111 which portions are on both sides of the mounting area 11c interposed therebetween and toward which portions the antenna pattern 112 extends. The retaining pins 16 correspond to an example of the retaining projection according to the invention.

Next, in the step of applying shown in part (c) of FIG. 2, the liquid thermosetting adhesive 13p is applied on the base 11. The thermosetting adhesive 13p has liquidity, and is applied to the mounting area 11c and the periphery of the mounting surface 11a of the base 11 in which 11c the IC chip 12 is mounted.

Next, in the step of mounting shown in parts (d) and (e) of FIG. 2, the IC chip 12 is mounted on the mounting area 11c of the base 11. The IC chip 12 is mounted on the base 11 using a flip-chip technology. That is, the IC chip 12 is mounted through the thermosetting adhesive 13p on the base 11 in a position in which a surface 12a on which a circuit is formed faces the base 11. Bumps 121, which are to be connected to the antenna pattern 112, are formed on the surface 12a on which the circuit of the IC chip 12 is formed. As shown in part (e) of FIG. 2, the IC chip 12 is mounted on the base 11 in a state in which positions of the bumps 121 and the antenna pattern 112 meet.

Next, in the step of holding shown in part (f) of FIG. 3, the base on which the IC chip 12 is mounted is held by a heating apparatus 2, while being pressed from both sides, i.e., the film side 111 and the IC chip 12 side of the base 11. The heating apparatus 2 has a heating head 21 and a heating stage 22 both for sandwiching the base 11. The heating head houses a heater not shown. In the step of holding, the heating head 21 abuts on the IC chip 12 and the heating stage 22 abuts on the film 111. The bumps 121 are securely contacted with the antenna pattern 112 through the step of holding shown in part (f) of FIG. 3. The heating apparatus 2, the heating head 21 and the heating stage 22 correspond to examples of the manufacturing apparatus of manufacturing an electronic device, the heating section and the supporting section according to the invention respectively.

Next, in the step of giving a tension shown in part (g) of FIG. 3, the pair of retaining pins 16 is pulled. The heating apparatus 2 according to the present embodiment is provided with a pair of pulling sections 23 for pulling the retaining pins 16. In the step of giving a tension, the pulling sections 23 are abutted on the retaining pins 16 and pull the pair of the retaining pins in directions opposite to the mounting area 11c so that the pair of the retaining pins 16 move away from each other. As a result, the tension is given to the base 11 in directions in which the film 111 spreads.

Next, in the step of heating shown in part (h) of FIG. 4, the heating head 21 is caused to generate heat so that the thermosetting adhesive 13p is heated and cured. By curing of the thermosetting adhesive 13p, the IC chip 12 is fixed to the base 11 in a state in which the bumps 12 contact the antenna pattern 112. Since the step of heating is performed in a state in which a tension is given to the base 11 in the directions in which the film 111 spreads, an expansion of the film 111 is absorbed although the film 111 is heated to be melt, thereby suppressing deformation of the film 11. Accordingly, a void to be generated in the thermosetting adhesive 13p by deformation of the film is prevented.

Next, in the removing step shown in part (i) of FIG. 4, the end sections 111s at the both sides of the film 111 are removed together with the retaining pins 16.

Upon completion of the removing step shown in part (i) of FIG. 4, the RID tag 1 (see FIG. 1) is obtained.

Next, according to a second embodiment of the invention, a manufacturing method different from that of the above-described embodiment will be described. In the following description of the second embodiment, each element same as each of the above-described embodiment will be denoted by the same symbol as that of the above embodiment, and differences between the second embodiment and the above-described embodiment will be mainly described. Hereinafter, the above-described embodiment may be referred to as a first embodiment.

A RFID tag of the second embodiment has a configuration similar to that of the RFID tag 1 according to the first embodiment shown in FIG. 1.

In manufacturing a RFID tag in the second embodiment, the step of setting a projection shown in part (b) of FIG. 2 is not performed and the RFID tag does not have a retaining pin. In manufacturing the RFID tag of the second embodiment, details of the step of giving a tension is different from the step shown in part (g) of FIG. 3. The conductor forming step shown in part (a) of FIG. 2, the conductor forming step shown in part (c) of FIG. 2 through part (f) of FIG. 3, the step of applying, the step of mounting and the step of holding are performed similarly to the first embodiment.

Figure 6:
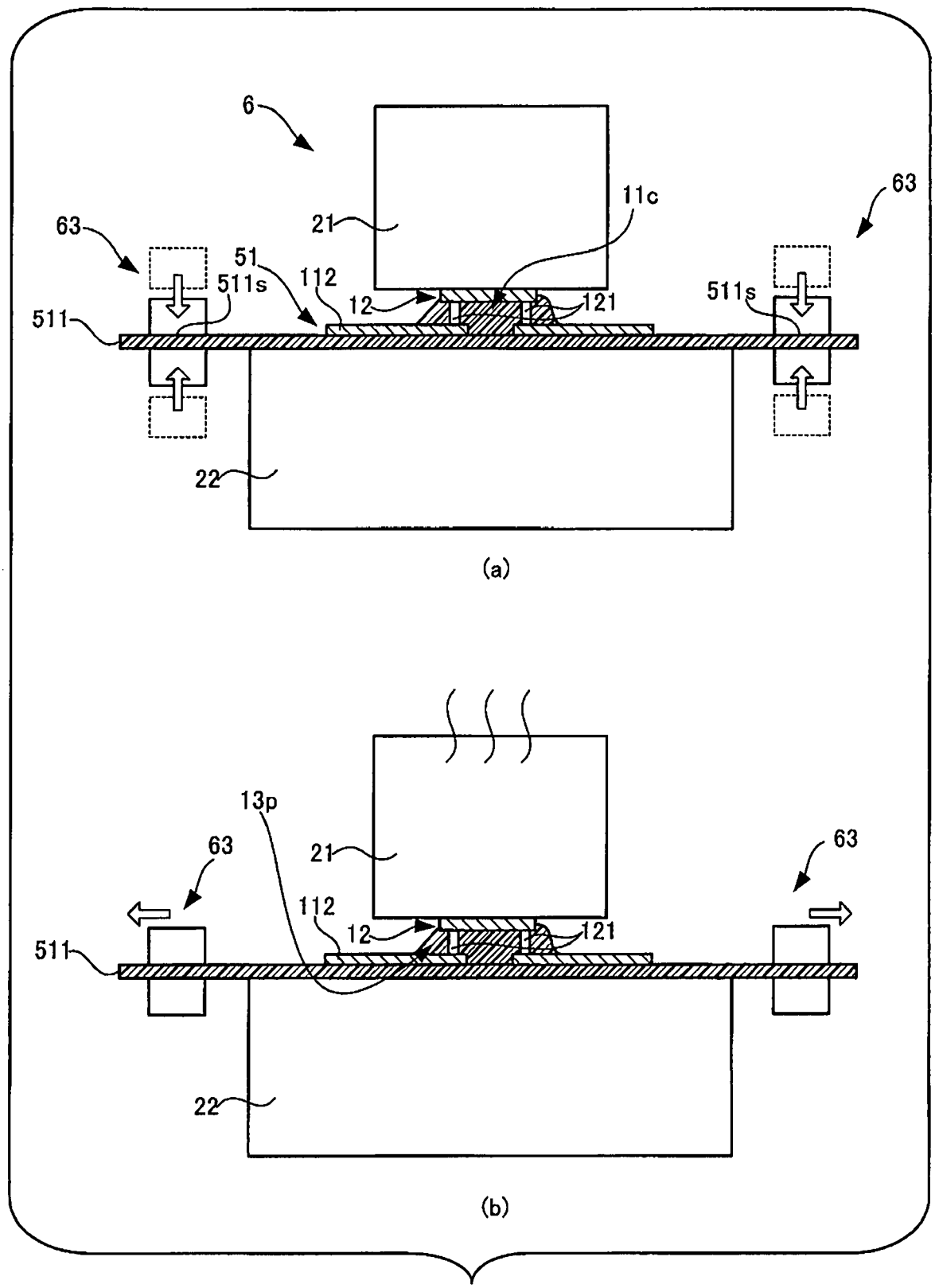
FIG. 6 is a diagram explaining each step in a manufacturing method manufacturing a RFID as a second embodiment of the invention.

FIG. 6 is a diagram explaining each step in a manufacturing method of manufacturing the RFID of the second embodiment of the invention.

As shown in FIG. 6, instead of the pulling section described referring to part (g) of FIG. 3, a holding section 63 having sections which sandwiches a film 511 is provided in a heating apparatus 6 used for manufacturing the RFID tag of the second embodiment.

In the step of giving a tension shown in part (a) of FIG. 6, a pair of holding sections 63 respectively hold end sections 511s on both sides of the film 511 such that a mounting area 11c in which an IC chip 12 is mounted in interposed therebetween and pull both end sections 511 in a direction in which the end sections 511 move away from each other. Thus, a base 51 is given a tension in a direction in which the film 511 spreads.

Next, in a step of heating shown in part (b) of FIG. 6, a heating head 21 of the heating apparatus 6 is caused to heat a thermosetting adhesive 13p to be cured. Similarly to the case of the first embodiment, since the step of heating is performed in a state in which a tension is given to the base 51 in the direction in which the film 511 spreads, deformation of the film 511 is suppressed although the film 51 is melt by heating.

After the step of giving a tension shown in part (b) of FIG. 6, similarly to the first embodiment, a RFID tag similar to the RFID tag according to the first embodiment shown in FIG. 1 is finished by removing the end sections 511s of the film in the removing step shown in part (i) of FIG. 4.

Next, a third embodiment according to the invention will be described. In the following description of the third embodiment, each element same as each of the above-described embodiments will be denoted by the same symbol as those of the above-described embodiments, and differences between the third embodiment and the above-described embodiments will be mainly described.

A RFID tag of the third embodiment also has a configuration similar to that of the RFID tag 1 according to the first embodiment shown in FIG. 1. However, the RFID tag of the third embodiment is manufactured in a manufacturing process different from that of the RFID tag 1 according to the first embodiment. Manufacturing of the RFID tag according to the third embodiment is a so-called multi-chip-bonding, in which multiple portions each to be a RFID tag are formed together on a base and then are finally separated from each other to obtain multiple RFID tags. In detail: a base is formed such that multiple conductive patterns corresponding to multiple RFID tags are formed side by side on a sheet of film; in an step of applying, a thermosetting adhesive is applied on each of the multiple conductive patterns; in a step of mounting, multiple IC chips are mounted on the base. However, since locking into each of the multiple portions becomes a RFID tag through the conductor forming step, the step of applying and the step of mounting similarly to the steps of the first embodiment shown in part (a) of FIG. 2 and part (c) of FIG. 2 through part (e) of FIG. 3, a drawing of the whole base for these steps is omitted.

Figure 7:
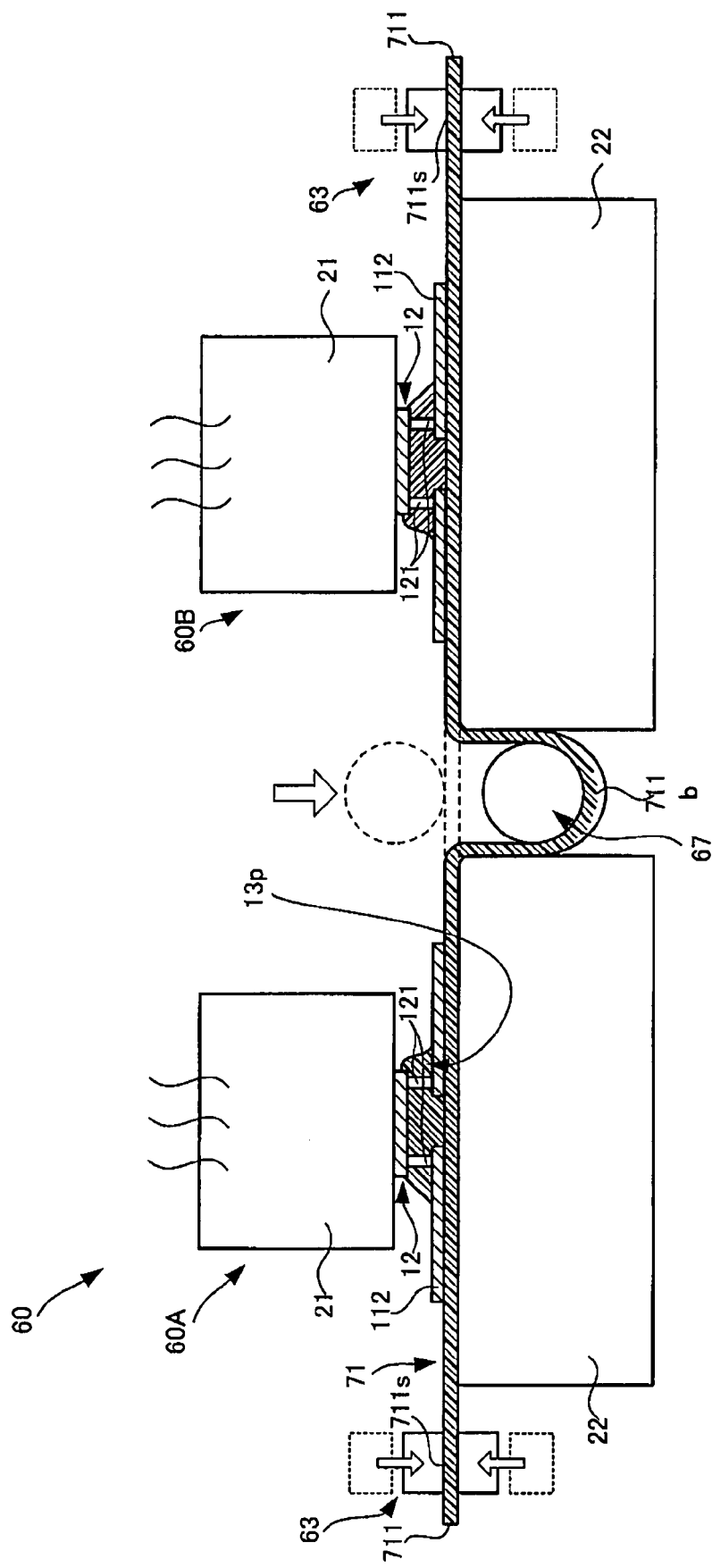
FIG. 7 is a diagram explaining each step in a manufacturing method manufacturing a RFID as a third embodiment of the invention.
Figure 8:
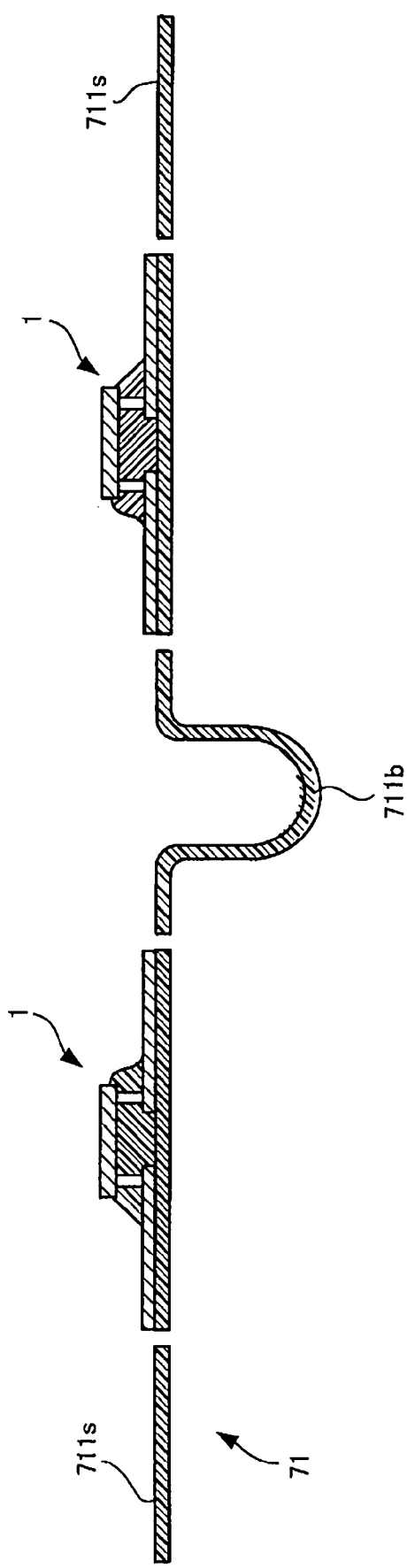
FIG. 8 is diagram showing a manufacturing step subsequent to the steps shown in FIG. 7.
Figure 9:
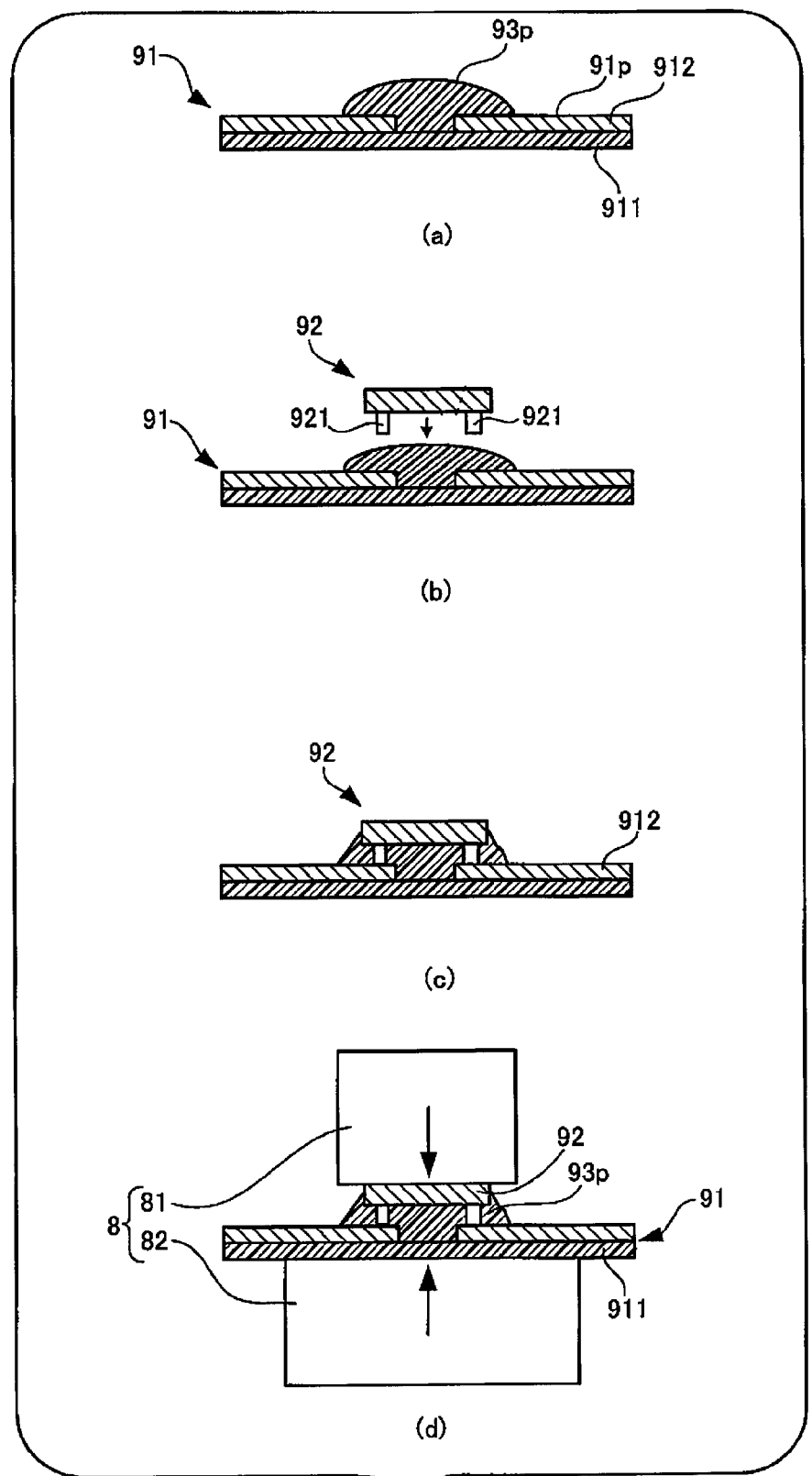
FIG. 9 is a diagram explaining a manufacturing method of a RFID tag in a conventional technique.
Figure 10:
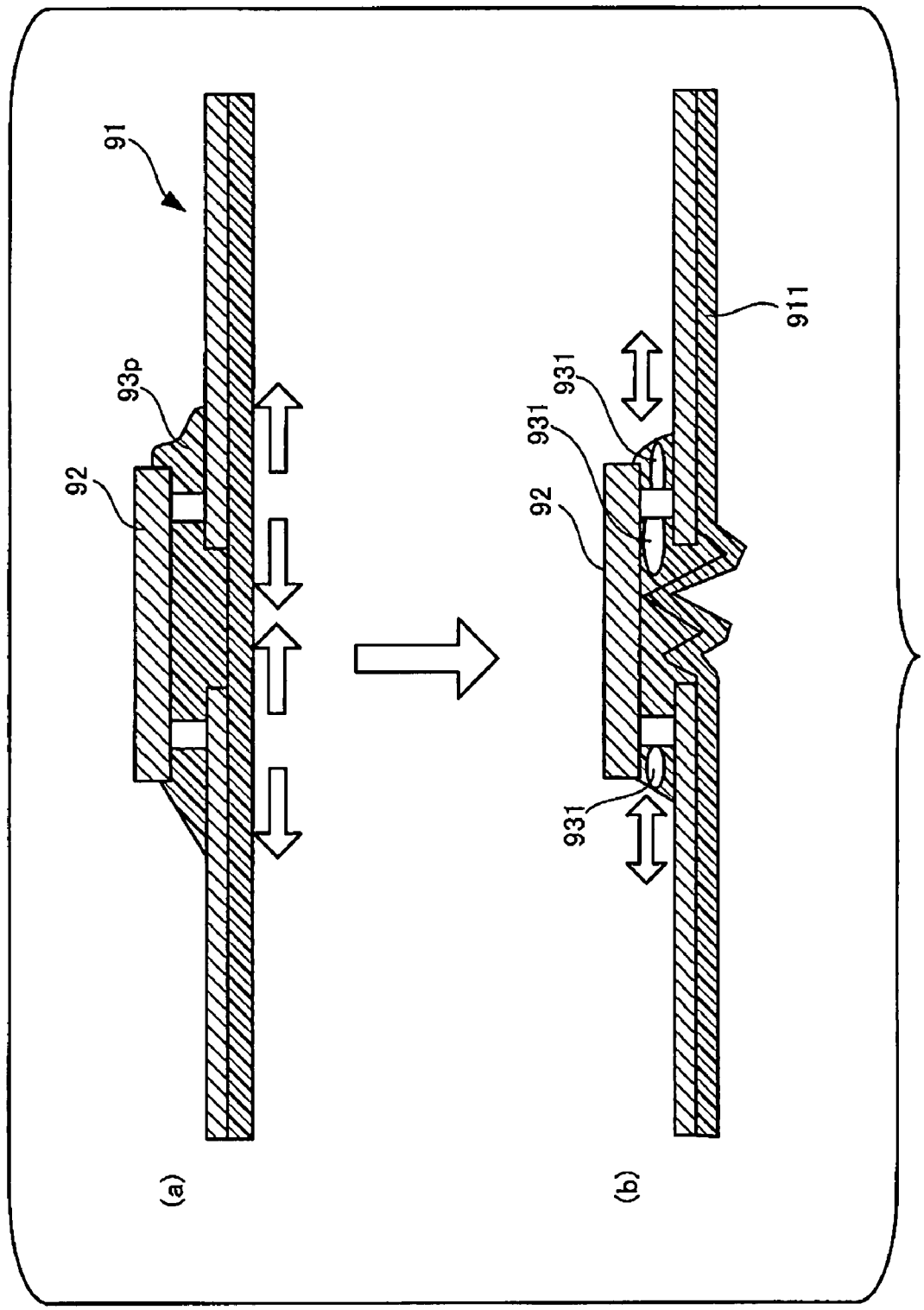
FIG. 10 is a diagram explaining a state of a base in the step of heating shown in FIG. 9.

FIGS. 7 and 8 are diagrams explaining each step in a manufacturing method of manufacturing the RFID as a third embodiment of the invention.

The step of holding, the step of giving a tension and the step of heating of the manufacturing steps are shown together in FIG. 7. Of the manufacturing steps, a step of cutting subsequent to the steps shown in FIG. 7 is shown in FIG. 8.

As shown in FIG. 7, two heating devices 60A and 60B are arranged in a heating apparatus 60 to be used in manufacturing the RFID tag according to the third embodiment. Each of the two heating devices 60A and 60B includes a combination of a heating head 21 and a heating stage 22. In addition, a roll 67 for pulling a film is arranged between the heating devices 60A and 60B. A pair of holding sections 63 is arranged at both sides of the roll 67 interposed therebetween. The roll 67 corresponds to an example of the fixture according to the invention.

In the step of holding, the heating apparatus 60 holds parts of the respective two antenna patterns adjacent to each other corresponding to multiple RFID tags on a base 71 formed on a sheet of a film 711, with the two heating devices 60A and 60B. On this occasion, the heating devices 60A and 60B of the heating apparatus 60 leaves a part 711b between the two antenna patterns 112 as it is.

Next, in the step of giving a tension, the holding sections 63 hold end sections 711s of the film 711 and simultaneously the roll 67 hooks and pulls down the part 711b remaining without being held by the heating devices 60A and 60B between the two antenna patterns 112 of the film 711. Thus, a tension is given to the base 71.

Next, in the step of heating, the heating head 21 of the heating apparatus 60 is caused to generate heat and heats the thermosetting adhesive 13p to be cured. Since the step of heating is performed in a state in which a tension is given in the direction in which the film 711 spreads, deformation of the film 711 is suppressed even though the film 711 is heated and melted.

Next, in a step of cutting shown in FIG. 8, plural RFID tags are formed by cutting the base 71. On this occasion, the part 711b remaining without being held by the heating devices 60A and 60B, and the end sections 711s are removed so that two RFID tags similar to the first embodiment shown in FIG. 1 are finished.

In addition, in the embodiment described above, examples of the methods and heating apparatuses to manufacture RFID tags have been described. However, the invention is not limited to the methods targeting a RFID tag, but the invention may be applied to any method as far as the method is for manufacturing an electronic device in which a circuit chip is mounted on a film-formed base. For example, the invention may be applied to manufacturing methods such as a method of manufacturing an extreme thin film IC card or a printed circuit board in which a circuit chip is fixed by a thermosetting adhesive on a flexible printed circuit board (FPC) as a base.

In addition, in the embodiments described above, the film included in the base of the RFID tag is described as a film made of a PET material. However, the film of an electronic device to which the invention is applied is not limited to such an example. A material may be selected from materials such as polyester, a polyolefin, a polycarbonate or an acryl.

In the embodiments described above, the heating stage is described as a not-heating element. However, the invention is not limited to such an example. The supporting section may heat together with the heating section.

Further, in the first embodiment described above, the example in which two pairs of the retaining pins 16 which have columnar shapes are set on the film 111 is explained. However, the invention is not limited to this example. The shape of the retaining pin may be, for example, a rectangular parallelepiped. The number of the retaining pins may be one pair or three pairs or more. Material of the retaining pin may a metal and the like.

Furthermore, in the third embodiment described above, the example in which two RFID tags are formed from one sheet of film is described. However, the invention is not limited to this example. Three of more RFID tags may be formed from one sheet of film. In addition, multiple RFID tags may be arranged in a matrix form on one sheet of film.

What is claimed is:

1. A manufacturing method of manufacturing an electronic device, comprising the steps of:
    applying a thermosetting adhesive on a surface of a base that is formed such that a conductive pattern is formed on a film made of a resin, the surface of the base being a side of the base on which side the conductive pattern is formed;
    mounting a circuit chip to be connected to the conductive pattern, on the base through the thermosetting adhesive;
    holding the base while pinching a circuit chip side of the base and a film side of the base by a heating apparatus that heats the thermosetting adhesive, the heating apparatus including a pressing section that presses the base by abutting on the circuit chip side of the base and a supporting section that supports the base by abutting on the film side of the base;
    giving a tension to the base on which the circuit chip is mounted, in a direction in which the film spreads; and
    heating the thermosetting adhesive by the heating apparatus to cure the thermosetting adhesive, thereby fixing the circuit chip to the conductive pattern,
    wherein the step of giving a tension is a step of holding portions of the film on both sides of the mounting area of the film in which mounting area the circuit chip is mounted, and pulling the portions in a direction in which the portions move away from each other.

2. A manufacturing method of manufacturing an electronic device, comprising the steps of:
    applying a thermosetting adhesive on a surface of a base that is formed such that a conductive pattern is formed on a film made of a resin, the surface of the base being a side of the base on which side the conductive pattern is formed;
    mounting a circuit chip to be connected to the conductive pattern, on the base through the thermosetting adhesive;
    holding the base while pinching a circuit chip side of the base and a film side of the base by a heating apparatus that heats the thermosetting adhesive, the heating apparatus including a pressing section that presses the base by abutting on the circuit chip side of the base and a supporting section that supports the base by abutting on the film side of the base;
    giving a tension to the base on which the circuit chip is mounted, in a direction in which the film spreads; and
    heating the thermosetting adhesive by the heating apparatus to cure the thermosetting adhesive, thereby fixing the circuit chip to the conductive pattern, wherein
    the base is formed such that a plurality of the conductive patterns are arranged side by side on a sheet of a film,
    the step of applying is a step of applying a thermosetting adhesive to each of the plurality of conductive patterns on the base, the step of mounting is a step of mounting each of a plurality of circuit chips on the base so that each of the circuit chips is connected to each of the plurality of conductive patterns, the step of holding is a step of holding each of the plurality of the conductive patterns such that a portion of the film between the conductive patterns adjacent to each other of the plurality of the conductive patterns on the base remains without being held, the step of giving a tension is a step of giving a tension to the base through pulling, by a fixture, the portion of the film that has remained without being held in the step of holding, and the manufacturing method further comprises the step of cutting the base to form a plurality of electronic devices.

* * * * *